United States Patent
Yamamoto et al.

(10) Patent No.: US 8,025,958 B2
(45) Date of Patent: Sep. 27, 2011

(54) MATERIAL WITH HARD COATING FILM FORMED ON SUBSTRATE SURFACE THEREOF

(75) Inventors: Kenji Yamamoto, Kobe (JP); Susumu Kujime, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 76 days.

(21) Appl. No.: 12/494,784

(22) Filed: Jun. 30, 2009

(65) Prior Publication Data

US 2010/0047545 A1 Feb. 25, 2010

(30) Foreign Application Priority Data

Aug. 20, 2008 (JP) .................... 2008-212116

(51) Int. Cl.
*B23B 27/14* (2006.01)

(52) U.S. Cl. ........ 428/216; 428/336; 428/697; 428/698; 428/699

(58) Field of Classification Search .................. 428/216, 428/336, 697, 698, 699
See application file for complete search history.

(56) References Cited

U.S. PATENT DOCUMENTS

| | | | | |
|---|---|---|---|---|
| 5,503,912 | A * | 4/1996 | Setoyama et al. | 428/216 |
| 6,220,797 | B1 * | 4/2001 | Ishii et al. | 428/698 |
| 6,824,601 | B2 * | 11/2004 | Yamamoto et al. | 428/699 |
| 6,884,499 | B2 * | 4/2005 | Penich et al. | 428/697 |
| 6,887,562 | B2 * | 5/2005 | Hugosson | 428/698 |
| 7,258,912 | B2 | 8/2007 | Yamamoto et al. | |
| 7,442,247 | B2 * | 10/2008 | Yamamoto | 106/286.1 |
| 7,695,829 | B2 * | 4/2010 | Yamamoto et al. | 428/697 |
| 7,749,594 | B2 * | 7/2010 | Åstrand et al. | 428/336 |
| 2007/0278090 | A1 | 12/2007 | Yamamoto et al. | |
| 2008/0038503 | A1 | 2/2008 | Yamamoto | |

FOREIGN PATENT DOCUMENTS

JP 2003-71611 3/2003

\* cited by examiner

*Primary Examiner* — Archene Turner
(74) *Attorney, Agent, or Firm* — Oblon, Spivak, McClelland, Maier & Neustadt, L.L.P.

(57) ABSTRACT

A hard-coated material having a substrate coated with a wear resistant and easily removed film is provided. The film comprises laminated alternately in succession, a lower layer-A having a composition of formula $Ti_vM_{1-v}(C_xN_yO_z)$ and an upper layer-B having a composition of formula $Ti_vCr_wM_{1-v-w}(C_xN_yO_z)$. At least two lamination units are provided and the ratio in thickness of a singularity of the layer-B to a singularity of the layer-A is at least 2. The thickness of a singularity of the layer-A is within the range of 0.1 to 3μm both inclusive, the thickness of a singularity of the layer-B is within the range of 1 to 10μm both inclusive, and the total thickness of a plurality of the layers-B is at least 5 μm.

6 Claims, 2 Drawing Sheets

MATERIAL WITH HARD COATING FILM FORMED ON SUBSTRATE SURFACE THEREOF

BACKGROUND OF THE INVENTION

1. Field of the Invention

The present invention relates to a material having a hard coating film formed on a substrate surface thereof, and more particularly a hard-coated material to be used as an item such as a cutting tool, a sliding component part, or a metal die for molding.

2. Description of the Related Art

Conventionally, a hard coating film made of such a substance as TiN (nitride of Ti), TiC (carbide of Ti), TiCN (carbonitride of Ti), TiAlN (complex nitride of Al and Ti), or TiAlCrN (complex nitride of Ti, Al and Cr) is formed on a substrate made of cemented carbide, cermet, or high-speed tool steel for enhancing the wear resistance thereof in the fabrication of cutting tools to be used for such purposes as meal cutting, drilling and end milling, metal dies to be used for such purposes as press molding and forging, and jigs and tools to be used for such purposes as punching and blanking.

For example, in Patent Document 1 indicated below, there is disclosed a hard-coated material to be used as a cutting tool, which is provided with a hard coating film having a component composition represented by the formula $(Ti_{1-a-b-c-d}, Al_a, Cr_b, Si_c, B_d)(C_{1-e}N_e)$, wherein $0.5 \leq a \leq 0.8$, $0.06 \leq b$, $0 \leq c \leq 0.1$, $0 \leq d \leq 0.1$, $0.01 \leq c+d \leq 0.1$, $a+b+c+d \leq 1$, and $0.5 \leq e \leq 1$ (where variables a, b, c, and d denote the atomic ratios of Al, Cr, Si, and B respectively, and variable e denotes the atomic ratio of N; the same shall apply hereinafter).

Patent Document 1:

Japanese Unexamined Patent Publication No. 2003-071611

The conventional hard coating film mentioned above has the following disadvantage, however.

In the current metal working by using a cutting tool or jig such as noted above, machining operations are performed at higher speed with higher surface pressure for increasing productivity, and there is a growing trend toward the use of a smaller amount of lubricant in consideration of friendliness to the environment. It is particularly noteworthy that hard coating films are subject to significant wear in today's practice of metal working in which steel workpieces having higher strength are processed.

In the use of a cutting tool or jig such as noted above, when a hard coating film formed on a substrate thereof wears to a certain extent, the hard coating film is selectively dissolved and removed from the substrate by an electrochemical method for the purpose of re-forming a new hard coating film on the substrate. Thus, the substrate having a new hard coating film can be recycled. However, in a situation where a relatively thick hard coating film has been formed on a substrate, it takes a considerable period of time to remove the hard coating film from the substrate, giving rise to a disadvantage in working efficiency. In particular, where a CrN-based coating film featuring superior corrosion resistance has been formed on a substrate for providing sliding wear resistance, it is rather difficult to remove the CrN-based coating film from the substrate, causing a hindrance to substrate recycling.

SUMMARY OF THE INVENTION

In the light of the above, it is an object of the present invention to provide a hard-coated material in which a substrate thereof is coated with a hard coating film that is excellent in wear resistance and also excellent in film removability to allow easy removal thereof once damaged or worn for the purpose of recycled use of the substrate.

In accomplishing this object of the present invention and according to one aspect thereof, there is provided a hard-coated material having a hard coating film formed on a substrate thereof, the hard coating film comprising: a layer-A; and a layer-B; wherein the layer-A has a component composition represented by the formula $Ti_vM_{1-v}(C_xN_yO_z)$, where M denotes at least one species selected from Group-4 elements, Group-5 elements, Group-6 elements, Si, Al, B, and Y (excluding Ti); and where the following expressions regarding variables v, x, y and z that indicate atomic ratios of the respective elements are satisfied: $0.6 \leq v \leq 1$, $0 \leq z \leq 0.1$, and $x+y+z=1$; and wherein the layer-B has a component composition represented by the formula $Ti_vCr_wM_{1-v-w}(C_xN_yO_z)$, where M denotes at least one species selected from Group-4 elements, Group-5 elements, Group-6 elements, Si, Al, B, and Y (excluding Ti and Cr); and where the following expressions regarding variables v, w, x, y and z that indicate atomic ratios of the respective elements are satisfied: $0 \leq v \leq 0.6$, $0.05 \leq w$, $v+w \leq 1$, $0 \leq x \leq 0.5$, $0 \leq z \leq 0.1$, and $x+y+z=1$. The layer-A and the layer-B are laminated alternately in succession. In terms of lamination units each corresponding to a combination of a singularity of the layer-A disposed at the lower level and a singularity of the layer-B disposed at the upper level, there are provided at least two lamination units in laminated structure formation. The ratio in thickness of a singularity of the layer-B to a singularity of the layer-A is at least 2. The thickness of a singularity of the layer-A is within the range of 0.1 to 3 μm both inclusive, the thickness of a singularity of the layer-B is within the range of 1 to 10 μm both inclusive, and the total thickness of a plurality of the layers-B is at least 5 μm.

In the arrangement mentioned above, the hard coating film is formed to have a laminated structure comprising a layer-A containing predetermined component elements at predetermined respective atomic ratios thereof, and a layer-B containing predetermined component elements at predetermined respective atomic ratios thereof. Further, the thickness of one layer-A and the thickness of one layer-B are predetermined, and the ratio in thickness of one layer-B to one layer-A is predetermined. Thus, both the wear resistance of the hard coating film and the film removability thereof are enhanced significantly. It is to be noted that the term "film removability" means the degree of easiness in hard coating film removal by using a film removing solution in an electrochemical-reaction-based immersion method.

Furthermore, according to another aspect of the present invention, there is provided a hard-coated material having a hard coating film formed on a substrate thereof, the hard coating film comprising: a layer-A; and a layer-B; wherein the layer-A has a component composition represented by the formula TiN; and wherein the layer-B has a component composition represented by the formula $(Ti_aCr_bAl_cSi_dB_e)(C_xN_y)$; where the following expressions regarding variables a, b, c, d, e, x, and y that indicate atomic ratios of the respective elements are satisfied: $0.05 \leq a \leq 0.3$, $0.1 \leq b \leq 0.4$, $0.4 \leq c \leq 0.75$, $0 \leq d \leq 0.15$, $0 \leq e \leq 0.1$, $a+b+c+d+e=1$, $0.5 \leq y \leq 1$, and $x+y=1$. Alternatively, there is provided a hard-coated material having a hard coating film formed on a substrate thereof, the hard coating film comprising: a layer-A; and a layer-B; wherein the layer-A has a component composition represented by the formula TiN; and wherein the layer-B has a component composition represented by the formula $(Nb_fCr_gAl_hSi_iB_j)(C_xN_y)$; where the following expressions regarding variables f, g, h, i, j, x, and y that indicate atomic ratios of the respective elements are satisfied: $0.05 \leq f \leq 0.3$, $0.1 \leq g \leq 0.4$, $0.4 \leq h \leq 0.7$, $0 \leq i \leq 0.15$, $0 \leq j \leq 0.1$, $f+g+h+i+j=1$, $0.5 \leq y \leq 1$, and $x+y=1$.

In the arrangement mentioned above, the wear resistance of the hard coating film can be enhanced further by properly specifying further details of the component compositions of the layer-A and layer-B.

Still further, according to another aspect of the present invention, it is preferable that the hard-coated material having a hard coating film formed on a substrate thereof as described above includes a protective CrN film having a thickness of at least 0.5 μm formed between the substrate and the coating film.

In the arrangement mentioned above, a predetermined protective film is disposed between the substrate and the hard coating film, thereby making it possible to protect the substrate from being dissolved or damaged by a film removing solution at the time of removal of the hard coating film from the substrate.

Since the hard-coated material according to the present invention comprises a hard coating film formed in a predetermined laminated structure as described above, the hard-coated material is excellent in wear resistance and also excellent in enhancement effect on film removability to allow easy removal the hard coating film once damaged or worn. Further, the protective film disposed between the substrate and the hard coating film can protect the substrate from being dissolved or damaged by a film removing solution at the time of removal of the hard coating film from the substrate.

DETAILED DESCRIPTION OF THE PREFERRED EMBODIMENTS

The hard-coated materials in accordance with the present invention will now be described below in detail by way of example with reference to the accompanying drawings. In the drawings, FIGS. 1A and 1B show cross sections of hard-coated materials according to preferred embodiments of the present invention, and FIG. 2 shows a schematic diagram of a hybrid-type film forming apparatus for depositing hard coating films on substrates according to a preferred embodiment of the present invention.

Figure 1A:
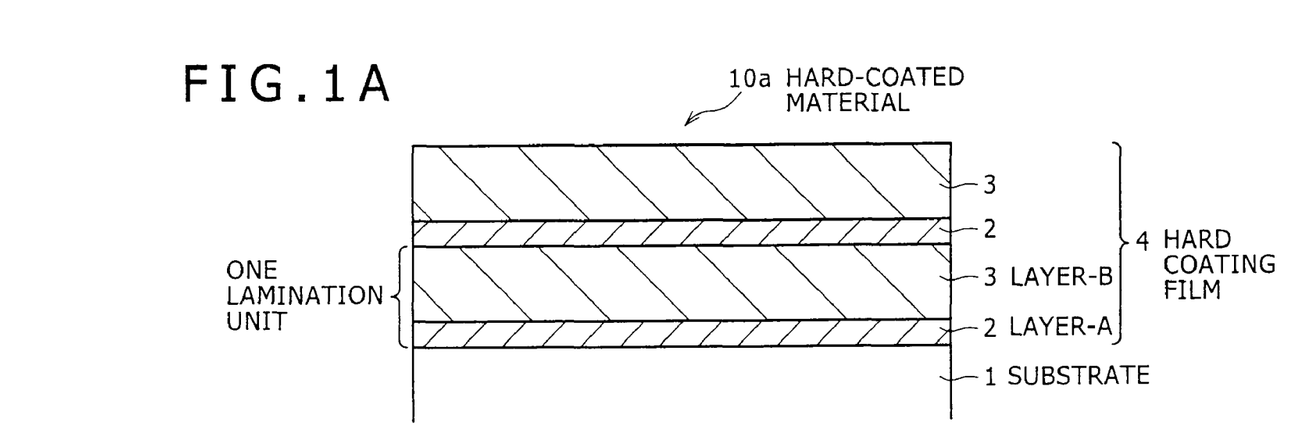
FIGS. 1A and 1B are sectional views of hard-coated materials according to preferred embodiments of the present invention.

As shown in FIG. 1A, a hard-coated material 10a according to a preferred embodiment of the present invention comprises a hard coating film 4 formed on a substrate 1 thereof. (For the sake of simplicity in description, the term "hard coating film" may be hereinafter referred to simply as "coating film" in some cases.) The coating film 4 includes a plurality of layers-A 2 each containing predetermined component elements in the ranges of predetermined respective atomic ratios thereof, and a plurality of layers-B 3 each containing predetermined component elements in the ranges of predetermined respective atomic ratios thereof. Each layer-A 2 and each layer-B 3 are laminated alternately in succession. In terms of lamination units each corresponding to a combination of a singularity of the layer-A 2 disposed at the lower level and a singularity of the layer-B 3 disposed at the upper level, there are provided at least two lamination units in laminated structure formation. The ratio in thickness of one layer-B 3 to one layer-A 2 is at least 2 (for the sake of simplicity in description, this ratio may be hereinafter referred to simply as the thickness ratio of layer-B 3 to layer-A 2 in some cases). The thickness of one layer-A 2, the thickness of one layer-B 3, and the total thickness of layers-B 3 are defined in composition. Further, as shown in FIG. 1B, there may also be provided a hard-coated material 10b including a protective CrN film 5 having a thickness of at least 0.5 μm which is sandwiched between a substrate 1 thereof and a hard coating film 4.

Figure 1B:
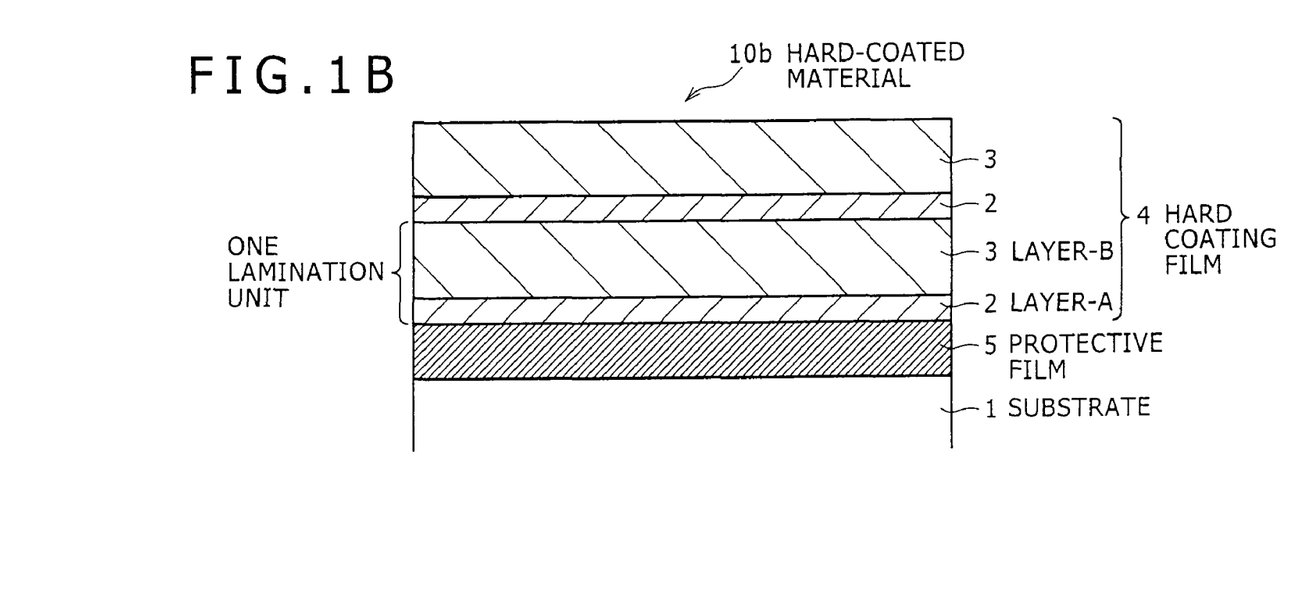
Figure 2:
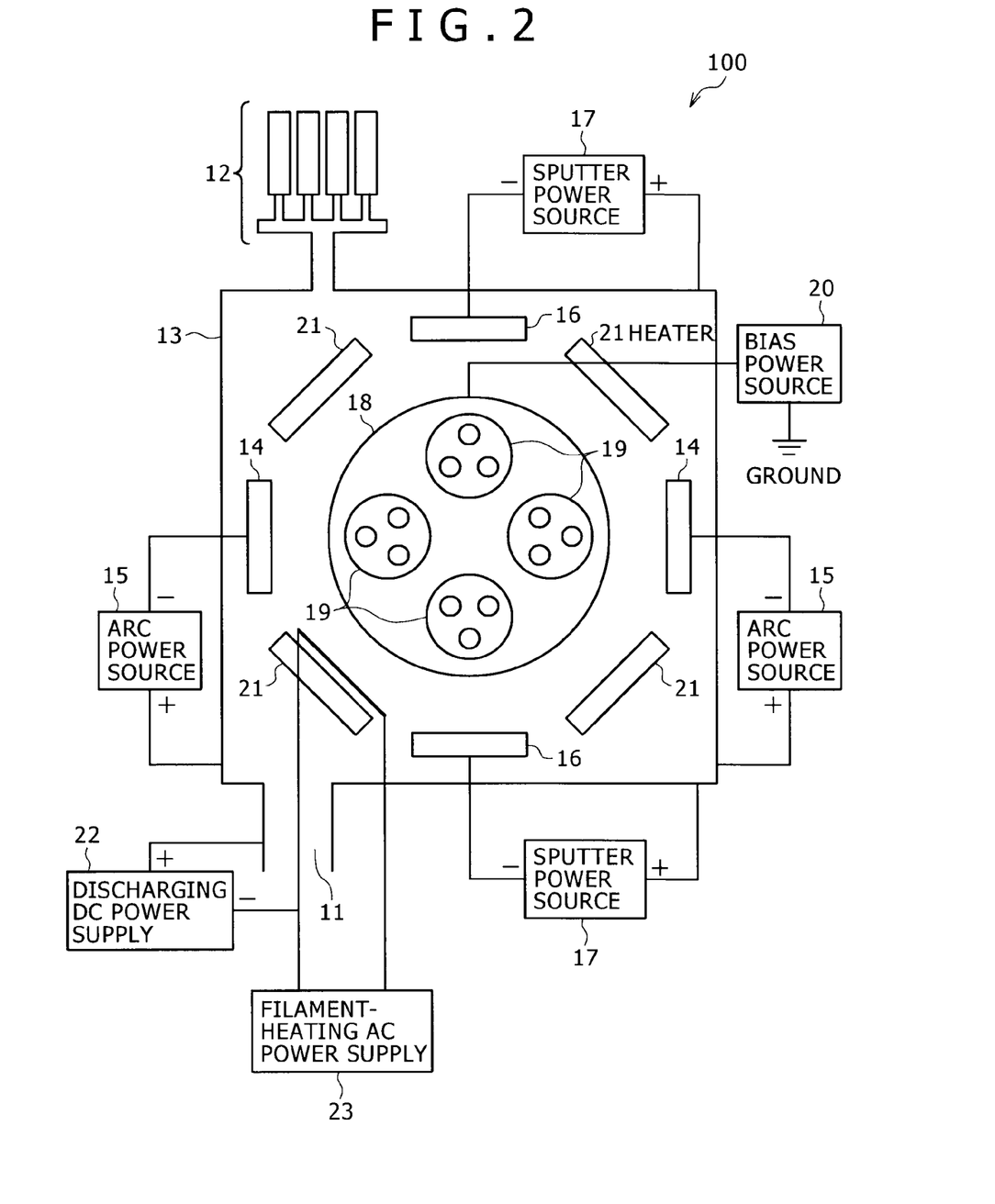
FIG. 2 is a schematic diagram showing a hybrid-type film forming apparatus for depositing hard coating films on substrates according to a preferred embodiment of the present invention.

It is to be noted that just two lamination units are arranged in the exemplary laminated structures shown in FIGS. 1A and 1B. The following describes further details of the hard-coated materials according to the preferred embodiments of the present invention.

<<Substrate>>

The substrate 1 is made of cemented carbide, iron-base alloy containing metallic carbide, cermet, or high-speed tool steel, for example. It is to be understood, however, that the substrate 1 is not limited to these examples and that any kind of substrate of a cutting tool for metal cutting, drilling or end milling, a metal die for press molding, forging or extrusion molding, a jig for punching, or the like is applicable as the substrate 1.

<<Layer-A>>

The layer-A 2 of the coating film 4 has a component composition represented by the formula $Ti_v M_{1-v}(C_x N_y O_z)$, where M denotes at least one species selected from Group-4 elements, Group-5 elements, Group-6 elements, Si, Al, B, and Y (excluding Ti); and where the following expressions regarding variables v, x, y and z that indicate atomic ratios of the respective elements are satisfied: $0.6 \leq v \leq 1$ (regarding metallic elements; applicable hereinafter), $0 \leq z \leq 0.1$, and $x+y+z=1$.

<Ti:v ($0.6 \leq v \leq 1$)>

Ti is added to the layer-A 2 to enhance the film removability thereof.

In the layer-A 2 comprising a nitride, carbide, carbonitride, oxynitride, oxycarbide, or oxycarbonitride of Ti, if the atomic ratio of Ti content is 0.6 or higher, the corrosion resistance thereof to a film removing solution is relatively low at the time of film removal using an electrochemical-reaction-based immersion method, making it easy to accomplish film removal. In contrast, if the atomic ratio of Ti content is lower than 0.6, the corrosion resistance to a film removing solution is relatively high, causing a longer time of film removal, i.e., a decrease in film removability. Hence, the atomic ratio of Ti content should be at least 0.6, not exceeding 1.

<M:1−v ($0 \leq 1-v \leq 0.4$)>

In addition to Ti mentioned above, at least one elemental species M selected from Group-4 element, Group-5 elements, Group-6 elements, Si, Al, B, and Y (excluding Ti) is added to the layer-A 2. Thus, the oxidation resistance, wear resistance, and film removability of the coating film 4 can be enhanced according to additive elements. In particular, since the addition of Al or W will contribute to higher film removability, it is recommended to add Al or W. It is to be noted that since a favorable degree of film removability can be provided under the condition that the atomic ratio of Ti content is at least 0.6 as mentioned above, the atomic ratio of M content to be added should not exceed 0.4.

<C:x, N:y, O:z ($0 \leq z \leq 0.1$, $x+y+z=1$)>

The layer-A 2 of the coating film 4 includes a compound form of a nitride, carbide, carbonitride, oxynitride, oxycarbide, or oxycarbonitride.

C and N are component elements for forming a compound having a high degree of hardness. A certain quantity of O may be contained in the layer-A 2. However, if the atomic ratio of 0 content exceeds 0.1, the layer-A 2 is deprived of electrical conductivity to cause a decrease in film removability. Hence, the atomic ratio of O content should be within the range of 0 to 0.1 both inclusive.

As mentioned above, Ti is an essential component element, and M, C, N, and O are optional component elements under the condition that at least one of elements C and N should be contained. Accordingly, the compositional combinations of component elements contained in the layer-A 2 are as follows, for example:
TiM(CNO), TiM(CN), TiM(NO), TiM(CO), TiMC, TiMN, Ti(CNO), Ti(CN), Ti(NO), Ti(CO), TiC, TiN, etc.

To be more specific as to the layer-A 2, the exemplary compositional combinations of component elements with atomic ratios thereof indicated are:
TiN, (Ti0.8Al0.2)N, (Ti0.8Cr0.2)N, Ti(C0.5N0.5), (Ti0.9Si0.1)N, (Ti0.95B0.05)N, (Ti0.8W0.2)N, (Ti0.8V0.2), etc.

<<Layer-B>>

The layer-B 3 of the coating film 4 has a component composition represented by the formula $Ti_vCr_wM_{1-v-w}(C_xN_yO_z)$, where M denotes at least one species selected from Group-4 elements, Group-5 elements, Group-6 elements, Si, Al, B, and Y (excluding Ti and Cr); and where the following expressions regarding variables v, w, x, y and z that indicate atomic ratios of the respective elements are satisfied: $0 \leq v \leq 0.6$, $0.05 \leq w$, $v+w \leq 1$, $0 \leq x \leq 0.5$, $0 \leq z \leq 0.1$, and $x+y+z=1$.

<Ti:v ($0 \leq v \leq 0.6$, $v+w \leq 1$)>

The layer-B 3 is formed for the purpose of providing wear resistance. If the atomic ratio of Ti content is 0.6 or higher, a decrease occurs in wear resistance. Hence, the atomic ratio of Ti content should be within the range of 0 inclusive to 0.6 exclusive.

<Cr:w ($0.05 \leq w$, $v+w \leq 1$)>

Cr is used as a component element for enhancement in wear resistance. If the atomic ratio of Cr content is lower than 0.05, a decrease occurs in wear resistance. Hence, the atomic ratio of Cr content should be at least 0.05. To produce an advantageous effect on wear resistance enhancement, the atomic ratio of Cr content should preferably be at least 0.1.

<M:1−v−w ($v+w \leq 1$)>

In addition to Ti and Cr mentioned above, at least one elemental species M selected from Group-4 element, Group-5 elements, Group-6 elements, Si, Al, B, and Y (excluding Ti and Cr) is added to the layer-B 3. Thus, the oxidation resistance, wear resistance, and film removability of the coating film 4 can be enhanced according to additive elements. In particular, the addition of Si will contribute to higher wear resistance. If the atomic ratio of Si content is 0.01 or higher, a hydroxide of Si is formed in a film removing solution to develop a tendency to decrease the film removability of the layer-B 3 itself. This possible disadvantage, however, can be circumvented by providing a laminated structure of the layer-A 2 and the layer-B 3 in combination, i.e., a decrease in the film removability of the coating film 4 as a whole can be eliminated owing to the laminated structure thereof comprising a combination of the layer-A 2 and the layer-B 3.

<C:x, N:y, O:z ($0 \leq x \leq 0.5$, $0 \leq z \leq 0.1$, $x+y+z$ 1)>

The layer-B 3 of the coating film 4 includes a compound form of a nitride, carbide, carbonitride, oxynitride, oxycarbide, or oxycarbonitride.

C and N are component elements for forming a compound having a high degree of hardness. A certain quantity of O may be contained in the layer-B 3.

The atomic ratios of C, N, and O contents in the layer-B 3 are to be determined in consideration of proper provision of wear resistance. If the atomic ratio of C content exceeds 0.5, the degree of hardness of the layer-B 3 decreases. Hence, the atomic ratio of C content should be within the range of 0 to 0.5 both inclusive. The atomic ratio of O content should be within the range of 0 to 0.1 both inclusive.

As mentioned above, Cr is an essential component element, and Ti, M, C, N, and O are optional component elements under the condition that at least one of elements C and N should be contained. Accordingly, the compositional combinations of component elements contained in the layer-B 3 are as follows, for example:
TiCrM(CNO), TiCrM(CN), TiCrM(NO), TiCrM(CO), TiCrMC, TiCrMN, CrM(CNO), CrM(CN), CrM(NO), CrM (CO), CrMC, CrMN, Cr(CNO), Cr(CN), Cr(NO), Cr(CO), CrC, CrN, etc.

To be more specific as to the layer-B 3, the exemplary compositional combinations of component elements with atomic ratios thereof indicated are:
CrN, (Ti0.1Cr0.2Al0.7)N, (Cr0.4Al0.6)N, (Ti0.2Cr0.2Al0.55Si0.05)N, (Nb0.2Cr0.2Al0.6)N, (Nb0.2Cr0.15Al0.6Si0.05)N, etc.

<Laminated Structure>>
<Laminated Structure of Layer-A and Layer-B: 2 or More Lamination Units>

According to the preferred embodiments of the present invention, the layer-A 2 and the layer-B 3 are laminated alternately so as to provide a film structure having an enhanced film removability. That is, in a film removal process wherein film removal is performed in a film removing solution by an electrochemical-reaction-based immersion method, the film removing solution permeates through micropores or crystalline interstices penetrating the layer-B 3 so as to dissolvedly remove the layer-A 2 under the layer-B 3, thereby making it possible to remove both the layer-A 2 and the layer-B 3 at the same time. Thus, the film removability of the coating film 4 as a whole is enhanced.

At least two lamination units each corresponding to a combination of the layer-A 2 and the layer-B 3 are repeated in laminated structure formation according to the preferred embodiments of the present invention. Therefore, after the layer-A 2 in the uppermost lamination unit is dissolvedly removed, i.e., after the uppermost lamination unit is removed, the layer-A 2 of the next lamination unit is then dissolvedly removed due to permeation of the film removing solution through micropores or crystalline interstices in the layer-B 3 of the next lamination unit. The coating film 4 can thus be removed entirely by repeating the above process step as required. Even if the film removability of the layer-B 3 is substantially low, the layer-B 3 can be removed by dissolvedly removing the layer-A 2. That is, since the layer-A 2 is disposed under the layer-B 3 in the laminated structure, it is allowed to enhance the film removability of the coating film 4 as a whole. It is also to be noted that an advantageous effect of providing enhancement in film removability cannot be brought about satisfactorily in a situation where less than two lamination units are provided in the laminated structure. Hence, the laminated structure should preferably have two or more lamination units each corresponding to a combination of the layer-A 2 and the layer-B 3.

<Thickness Ratio of Layer-B to Layer-A: 2 or Higher>

The layer-B 3 is formed to provide wear resistance. Therefore, if the thickness of the layer-B 3 is smaller than that of the layer-A 2 with respect to a predetermined thickness ratio thereof, a decrease occurs in the wear resistance of the coating film 4. More specifically, if the thickness ratio of the layer-B 3 to the layer-A 2 is lower than 2, the proportion of the layer-A2 in the coating film 4 increases to cause a decrease in the wear resistance of the coating film 4. Hence, the thickness ratio of the layer-B 3 to the layer-A 2 should be at least 2, preferably at least 5.

<Thickness of Layer-A (Per Layer-A): 0.1 to 3 µm>

If the layer-A 2 has a thickness of less than 0.1 µm, the layer-A 2 may not be sufficiently sandwiched between the upper and lower layers-B 3 thereof to cause an inadequately laminated structure formation, resulting in a decrease in film removability. Contrastingly, if the layer-A 2 has a thickness of more than 3 µm, a longer time of film removal is required to cause a decrease in film removability. Hence, the thickness of the layer-A 2 should be within the range of 0.1 to 3 µm both inclusive, preferably within the range of 0.5 to 2 µm.

<Thickness of Layer-B (Per Layer-B): 1 to 10 µm>

Since the layer-B 3 is formed to provide wear resistance, the layer-B 3 should have a thickness of at least 1 µm. Contrastingly, if the layer-B 3 has a thickness of more than 10 µm, a decrease occurs in effective enhancement of a film removal rate even on the condition that the layer-A 2 is formed under the layer-B 3, resulting in a decrease in film removability. Hence, the thickness of the layer-B 3 should be within the range of 1 to 10 µm both inclusive, preferably within the range of 1 to 5 µm, and more preferably within the range of 1 to 3 µm.

<Total Thickness of Layers-B: 5 µm or More>

The above-mentioned removal procedure for the coating film 4 is advantageously effective in cases where the total thickness of a plurality of the layers-B 3 included in the coating film 4 is relatively large. In particular, the removal procedure for the coating film 4 is more advantageously effective in cases where the total thickness of a plurality of the layers-B 3 included in the coating film 4 is 5 µm or more. If the total thickness of the layers-B 3 is less than 5 µm, a decrease occurs in wear resistance. Hence, the total thickness of the layers-B 3 should be at least 5 µm, preferably at least 8 µm.

To prevent a decrease in processing accuracy, the upper limit of the overall thickness of the coating film 4 should be 25 µm, preferably 20 µm.

While the coating film 4 according to the preferred embodiments should be composed as described above, it is further preferable that the layer-A 2 and the layer-B 3 in particular should be composed as stated below for the purpose of providing higher enhancement in wear resistance.

<<Layer-A>>

The layer-A 2 has a component composition of TiN. In the TiN composition, the content of Ti is relatively large to provide an adequate degree of film removability. Further, in cases where TiN is used with no additive element M for forming the layer-A2, a Ti target available at relatively low cost is applicable, which signifies an industrial advantage in terms of manufacturing cost.

<<Layer-B>>

The layer-B 3 is formed as a coating based on TiCrAl or NbCrAl. The following describes TiCrAl-based coating and NbCrAl-based coating in detail.

(TiCrAl-Based Coating)

In formation as a TiCrAl-based coating, the layer-B 3 has a component composition represented by the formula $(Ti_a Cr_b Al_c Si_d B_e)(C_x N_y)$; where the following expressions regarding variables a, b, c, d, e, x, and y that indicate atomic ratios of the respective elements are satisfied: $0.05 \leq a \leq 0.3$, $0.1 \leq b \leq 0.4$, $0.4 \leq c \leq 0.75$, $0 \leq d \leq 0.15$, $0 \leq e \leq 0.1$, $a+b+c+d+e=1$, $0.5 \leq y \leq 1$, and $x+y=1$.

<Ti:a ($0.05 \leq a \leq 0.3$, $a+b+c+d+e=1$)>

Ti is a component element for suppressing oxidative wear and enhancing wear resistance in the layer-B 3. For wear resistance enhancement, Ti should be added at an atomic ratio of at least 0.05. It is to be noted that excessive addition of Ti decreases the content of Al relatively to bring about a tendency to decrease wear resistance. Hence, the atomic ratio of Ti additive content should not exceed 0.3.

<Cr:b ($0.1 \leq b \leq 0.4$, $a+b+c+d+e=1$)>

In the layer-B 3, Al by itself forms a hexagonal crystal structure having a soft characteristic. It is therefore required to add Cr at an atomic ratio of at least 0.1 for providing a high degree of hardness in the layer-B 3. Thus, sliding wear can be suppressed. It is to be noted, however, that excessive addition of Cr decreases the content of Al relatively to cause no suppression of oxidative wear, thereby bringing about a tendency to decrease wear resistance. Hence, the atomic ratio of Cr additive content should not exceed 0.4.

<Al:c ($0.4 \leq c \leq 0.75$, $a+b+c+d+e=1$)>

Al is a component element for providing wear resistance in the layer-B 3. If the atomic ratio of Al content is lower than 0.4, oxidative wear in the layer-B 3 cannot be suppressed, resulting in a tendency toward inadequate resistance to wear. Contrastingly, if the content of Al is excessive, the layer-B 3 is softened to cause no suppression of sliding wear, resulting in a tendency to decrease wear resistance. Hence, the atomic ratio of Al additive content should not exceed 0.75.

<Si:d ($0 \leq d \leq 0.15$, $a+b+c+d+e=1$)>

The addition of Si can enhance wear resistance. It is to be noted that the inclusion of Si forms a hydroxide of Si in a film removing solution to develop a tendency to decrease the film removability of the layer-B 3 itself. This possible disadvantage, however, can be circumvented by providing a laminated structure of the layer-A 2 and the layer-B 3 in combination, i.e., a decrease in the film removability of the coating film 4 as a whole can be eliminated owing to the laminated structure thereof comprising the layer-A 2 and the layer-B 3. Since excessive addition of Si makes a decrease in hardness likely to occur, the atomic ratio of Si additive content should not exceed 0.15. For producing an advantageous effect of enhancing wear resistance by adding Si, though the addition of Si is not necessarily required, the atomic ratio of Si additive content should preferably be at least 0.01.

<B:e ($0 \leq e \leq 0.1$, $a+b+c+d+e=1$)>

The addition of B provides a higher degree of hardness in the layer-B 3. It is to be noted that if the atomic ratio of B additive content exceeds 0.1, there occurs a tendency toward inadequate enhancement of hardness in the layer-B 3. Hence, the atomic ratio of B additive content should not exceed 0.1. For producing an advantageous effect of providing a higher degree of hardness by adding B, though the addition of B is not necessarily required, the atomic ratio of B additive content should preferably be at least 0.01.

<C:x, N:y ($0.5 \leq y \leq 1$, and $x+y=1$)>

C and N are component elements for forming a compound having a high degree of hardness. If the atomic ratio of N additive content is lower than 0.5, there occurs a tendency toward inadequate enhancement of hardness in the layer-B 3. Hence, the atomic ratio of N additive content should be at least 0.5.

(NbCrAl-Based Coating)

In formation as a NbCrAl-based coating, the layer-B 3 has a component composition represented by the formula $(Nb_f Cr_g Al_h Si_i B_j)(C_x N_y)$; where the following expressions regarding variables f, g, h, i, j, x, and y that indicate atomic ratios of the respective elements are satisfied: $0.05 \leq f \leq 0.3$, $0.1 \leq g \leq 0.4$, $0.4 \leq h \leq 0.7$, $0 \leq i \leq 0.15$, $0 \leq j \leq 0.1$, $f+g+h+i+j=1$, $0.5 \leq y \leq 1$, and $x+y=1$.

<Nb:f ($0.05 \leq f \leq 0.3$, $f+g+h+i+j=1$)>

Nb is a component element for suppressing oxidative wear and enhancing wear resistance in the layer-B 3. If the atomic ratio of Nb additive content is lower than 0.05, the content of Al increases relatively to soften the layer-B 3 to cause no suppression of sliding wear, resulting in a tendency to decrease wear resistance. Contrastingly, if the atomic ratio of Nb additive content exceeds 0.3, the content of Al decreases relatively to cause no suppression of oxidative wear, resulting in a decrease in wear resistance. Hence, the atomic ratio of Nb additive content should not exceed 0.3.

The reasons for additions of elements Cr, Al, Si, B, C, and N, and the reasons for limitations on additive contents thereof in the NbCrAl-based coating are the same as those in the TiCrAl-based coating mentioned above, and therefore, no repetitive description thereof is given herein.

The wear resistance of the layer-B 3 can be enhanced by providing one of the above-mentioned component compositions therein. The layer-B 3 having any of these component compositions is excellent in resistance to sliding wear since the atomic ratio of Cr content is at least 0.05 or the atomic ratio of Ti content is lower than 0.6.

<<Protective Film>>

As shown in FIG. 1B, the hard-coated material 10b comprises a substrate 1, a hard coating film 4, and a protective CrN film 5 having a thickness of at least 0.5 μm which is sandwiched between the substrate 1 and the hard coating film 4.

In cases where cemented carbide or iron-base alloy containing metallic carbide is used as a substrate 1 of a hard-coated material having no protective film such as mentioned above, the removal of a coating film 4 from the substrate 1 by an electrochemical-reaction-based immersion method results in WC (tungsten carbide) being dissolvedly removed from the substrate 1 (made of cemented carbide) or metallic carbide being dissolvedly removed from the substrate (made of iron-base alloy containing metallic carbide) at the same time, giving rise to a problem such as a roughened surface of the substrate 1. To circumvent this condition, a protective film (CrN film) 5 having excellent corrosion resistance is formed between the substrate 1 and the coating film 4. In a film removal process, only the coating film 4 formed over the protective film 5 is removed to prevent the substrate 1 from being dissolved or damaged at the time of immersion in a film removing solution. It is to be noted that, in cases where the protective film 5 is provided, the degree of protection for the substrate 1 varies depending on the thickness of the protective film 5. Hence, the thickness of the protective film 5 should be at least 0.5 μm, preferably at least 2 μm, and more preferably at least 5 μm. Although an increase in the thickness of the protective film 5 provides an increase in corrosion resistance, i.e., an increase in the degree of protection for the substrate 1, the effectiveness of corrosion resistance enhancement is saturated when the thickness of the protective film 5 exceeds 10 μm. Hence, the upper limit of the thickness of the protective film 5 should be approximately 10 μm.

Then, an exemplary method for forming hard coating films on substrates by using a hybrid-type film forming apparatus is described below with reference to FIG. 2. It is to be understood that the present invention is not limited to this exemplary film forming method.

Referring to FIG. 2, there is illustrated a hybrid-type film forming apparatus 100, which comprises an evacuation port 11 for chamber evacuation, a chamber 13 having a gas supply port 12 for feeding film forming gases and rare gases, an arc power source 15 connected to an arc evaporation source 14, a sputter power source 17 connected to a sputter evaporation source 16, a substrate holding mount 19 on a substrate stage 18 for holding an object under processing (substrate to be coated) (not shown), and a bias power source 20 for applying a negative bias voltage to the object under processing through the substrate holding mount 19 in the chamber 13. In addition, the hybrid-type film forming apparatus 100 is provided with a heater 21, a discharging DC power supply 22, a filament-heating AC power supply 23, etc.

The arc evaporation source 14 is used to carry out arc ion plating deposition (AIP), and the sputter evaporation source 16 is used to carry out unbalanced magnetron sputtering deposition (UBM).

In the hybrid-type film forming apparatus 100, a target made of alloy or metal having a predetermined component composition (not shown) is mounted on a cathode (not shown), and as an object under processing, a substrate (not shown) is set on the substrate holding mount 19 equipped on the substrate stage 18 (rotary type). Then, the chamber 13 is evacuated (below $1 \times 10^{-3}$ Pa) to provide a vacuum state in the inside thereof. Thereafter, the substrate is heated up to approximately 400° C. by the heater 21 in the chamber 13, and sputter cleaning with Ar ions is carried out by using the sputter evaporation source 16 to form a layer-A. Then, arc ion plating is carried out by using the arc evaporation source 14 to form a layer-B. The conditions of arc ion plating are as follows: A target having a size of ø100 mm is used, an arc current of 150 A is applied, and an atmosphere of $N_2$ gas is provided at a total pressure of 4 Pa. In the case of inclusion of carbon, an atmosphere of $CH_4$ gas or mixture gas of $N_2$ and $CH_4$ is provided. In the case of inclusion of oxygen, an atmosphere with $O_2$ gas added is provided. In the case of forming a protective film, a Cr target is employed, and in an atmosphere of $N_2$ gas, sputter cleaning or arc ion plating is carried out.

For laminated structure formation, a plurality of targets having different component compositions are mounted on a plurality of evaporation sources respectively, and a substrate is set on the substrate holding mount 19 (rotary type). Thus, by turning the substrate, a plurality of lamination layers can be deposited thereon. More specifically, with the targets having different component compositions mounted on the plurality of evaporation sources, as the substrate stage 18 rotates, the substrate on the substrate holding mount 19 is passed along the front positions of the plurality of evaporation sources alternately. In this operation, a plurality of lamination layers, each of which corresponds to a particular component composition of each target mounted on each of the evaporation sources, are formed on the substrate in an alternate fashion, thereby making up coating film having a laminated structure. The thickness of each of the layer-A and layer-B, and the number of lamination units contained in laminated structure formation can be controlled according to a level of input power to each evaporation source (rate of evaporation) or a rotational speed of the substrate holding mount 19 (the thickness per layer decreases with an increase in rotational speed).

Applicable examples of the above hard-coated materials having excellent wear resistance and film removability include: cutting tools for metal cutting, drilling or end milling, metal dies for press molding, forging or extrusion molding, jigs for punching, etc.

EXAMPLES

The present invention will be described in more detail with reference to the following examples; however, it is to be understood that the present invention is not limited by any of the details of the following examples and that various changes and modifications may be made in the present invention without departing from the spirit and scope thereof.

In the following examples, hard coating films were formed on substrates by using the hybrid-type film coating apparatus shown in FIG. 2.

Example 1

Each target made of alloy or metal having a predetermined component composition was mounted on each cathode of the hybrid-type film forming apparatus, and a mirror-finished JIS-SKD11 substrate (object under processing) was set on each substrate holding mount equipped on the substrate stage. Then, the chamber was evacuated (below $1 \times 10^{-3}$ Pa) to provide a vacuum state in the inside thereof. Thereafter, the substrate was heated up to approximately 400° C. by the heater in the chamber, and sputter cleaning with Ar ions was carried by using the sputter evaporation source to form a layer-A. Then, arc ion plating was carried out by using the arc evaporation source to form a layer-B. The conditions of arc ion plating were as follows: A target having a size of ⌀100 mm was used, an arc current of 150 A was applied, and an atmosphere of $N_2$ gas was provided at a total pressure of 4 Pa. In the case of inclusion of carbon, an atmosphere of $CH_4$ gas or mixture gas of $N_2$ and $CH_4$ was provided. In the case of inclusion of oxygen, an atmosphere with $O_2$ gas added was provided.

In coating film formation, the layer-A was formed on the substrate by using a target having a component composition corresponding to that of the layer-A. Then, the substrate stage was rotated for evaporation source changeover, and the layer-B was formed on the layer-A by using a target having a component composition corresponding to that of the layer-B. The above steps were repeated to form a coating film in a laminated structure comprising a plurality of lamination units each containing the layer-A and layer-B. The thickness of each of the layer-A and layer-B, and the number of lamination units in laminated structure formation were controlled according to a level of input power to each evaporation source (rate of evaporation) or a rotational speed of the substrate holding mount.

After completion of the coating film formation mentioned above, the metallic component composition of the coating film was examined, and also the wear resistance and film removability of the coating film were evaluated.

<Component Composition of Coating Film>

The composition of metallic component elements in each of the layer-A and layer-B was measured by using an EPMA (Electron Probe Micro Analyzer).

<Wear Resistance>

For wear resistance evaluation, a high-temperature sliding test was conducted under the following conditions, and the depth of wear in each sample was measured. Samples having a depth of wear of less than 5 μm were judged to be acceptable, and samples having a depth of wear of 5 μm or more were judged to be unacceptable.

[High-Temperature Sliding Test Conditions]
Apparatus: Sliding tester of vane-on-disc type
Vane: SKD61 steel (HRC50)
Disc: SKD11 steel (HRC60) with a coating film formed
Sliding rate: 0.2 m/second
Load: 500 N
Sliding distance: 2,000 m
Test temperature: 400° C.

<Film Removability>

Each sample of interest was immersed in an aqueous solution containing 10 mol % of sodium hydroxide (at a temperature of 50° C.), and a period of time taken for removal of the entire coating film from the sample of interest was determined. In addition, each control reference sample having a coating film, with no layer-A, in the same film thickness as that of the sample of interest was prepared, and a period of time taken for film removal from the control reference sample thus prepared was determined in the same manner.

Based on the condition "Film removal time taken for sample of interest÷Film removal time taken for control reference sample", the degree of enhancement effect on film removability was evaluated. The above-noted condition signifies that as the quotient of this division is smaller, the degree of enhancement effect in terms of film removal rate is higher. In case that the quotient was less than 0.7, the degree of enhancement effect on film removability was judged to be acceptable. In case that the quotient was 0.7 or more, the degree of enhancement effect on film removability was judged to be unacceptable.

TABLES 1 and 2 show the results of the evaluations mentioned above. In these TABLES, the resultant numeric values not satisfying the acceptable ranges specified above are underlined.

TABLE 1

| No. | Layer-A Component composition | Layer-A Thickness (μm) | Layer-B Component composition | Layer-B Thickness (μm) | Total thickness (μm) | Number of lamination units in laminated structure | Thickness ratio of layer-B to layer-A (Thickness of layer-B/ Thickness of layer-A) | Wear resistance Depth of wear (μm) | Film removability (Film removal time taken for sample of interest/ Film removal time taken for control reference sample) |
|---|---|---|---|---|---|---|---|---|---|
| 1 | TiN | <u>0.05</u> | (Ti0.2Cr0.2Al0.55Si0.05)N | 7 | 14 | 2 | 140.0 | 2 | <u>0.94</u> |
| 2 | TiN | 0.1 | (Ti0.2Cr0.2Al0.55Si0.05)N | 7 | 14 | 2 | 70.0 | 2.3 | 0.56 |
| 3 | TiN | 2 | (Ti0.2Cr0.2Al0.55Si0.05)N | 7 | 14 | 2 | 3.5 | 2.4 | 0.33 |
| 4 | TiN | 3 | (Ti0.2Cr0.2Al0.55Si0.05)N | 7 | 14 | 2 | 2.3 | 2.4 | 0.61 |
| 5 | TiN | <u>5</u> | (Ti0.2Cr0.2Al0.55Si0.05)N | 3 | 6 | 2 | <u>0.6</u> | <u>5.5</u> | <u>0.89</u> |
| 6 | TiN | 0.5 | (Ti0.2Cr0.2Al0.55Si0.05)N | <u>0.3</u> | 9.9 | 33 | <u>0.6</u> | <u>8</u> | 0.38 |
| 7 | TiN | 0.5 | (Ti0.2Cr0.2Al0.55Si0.05)N | 1 | <u>2</u> | 2 | 2.0 | <u>7</u> | <u>0.80</u> |
| 8 | TiN | 0.5 | (Ti0.2Cr0.2Al0.55Si0.05)N | 1 | <u>3</u> | 3 | 2.0 | <u>5.6</u> | 0.60 |
| 9 | TiN | 0.5 | (Ti0.2Cr0.2Al0.55Si0.05)N | 1 | 5 | 5 | 2.0 | 3.4 | 0.40 |

TABLE 1-continued

| | Layer-A | | Layer-B | | | Number of lamination | Thickness ratio of layer-B to layer-A (Thickness of layer-B/ Thickness of layer-A) | Wear resistance | Film removability (Film removal time taken for sample of interest/ Film removal time taken for control reference sample) |
|---|---|---|---|---|---|---|---|---|---|
| No. | Component composition | Thickness (μm) | Component composition | Thickness (μm) | Total thickness (μm) | units in laminated structure | | Depth of wear (μm) | |
| 10 | TiN | 0.5 | (Ti0.2Cr0.2Al0.55Si0.05)N | 2 | 8 | 4 | 4.0 | 2.8 | 0.40 |
| 11 | TiN | 0.5 | (Ti0.2Cr0.2Al0.55Si0.05)N | 1 | 10 | 10 | 2.0 | 3.3 | 0.30 |
| 12 | TiN | 0.5 | (Ti0.2Cr0.2Al0.55Si0.05)N | 3 | 9 | 3 | 6.0 | 3.5 | 0.35 |
| 13 | TiN | 0.5 | (Ti0.2Cr0.2Al0.55Si0.05)N | 5 | 10 | 2 | 10.0 | 2.5 | 0.45 |
| 14 | TiN | 0.5 | (Ti0.2Cr0.2Al0.55Si0.05)N | 8 | 16 | 2 | 16.0 | 2.4 | 0.50 |
| 15 | TiN | 0.5 | (Ti0.2Cr0.2Al0.55Si0.05)N | 10 | 20 | 2 | 20.0 | 2.3 | 0.62 |
| 16 | TiN | 0.5 | (Ti0.2Cr0.2Al0.55Si0.05)N | 15 | 30 | 2 | 30.0 | 2.2 | 1.00 |
| 17 | TiN | 1 | (Ti0.2Cr0.2Al0.55Si0.05)N | 5 | 10 | 2 | 5.0 | 2.1 | 0.45 |
| 18 | (Ti0.8Al0.2)N | 1 | (Ti0.2Cr0.2Al0.55Si0.05)N | 5 | 10 | 2 | 5.0 | 2.3 | 0.53 |
| 19 | (Ti0.6Al0.4)N | 1 | (Ti0.2Cr0.2Al0.55Si0.05)N | 5 | 10 | 2 | 5.0 | 2.7 | 0.58 |
| 20 | (Ti0.4Al0.6)N | 1 | (Ti0.2Cr0.2Al0.55Si0.05)N | 5 | 10 | 2 | 5.0 | 2.5 | 1.06 |
| 21 | (Ti0.2Al0.8)N | 1 | (Ti0.2Cr0.2Al0.55Si0.05)N | 5 | 10 | 2 | 5.0 | 2.6 | 1.14 |
| 22 | (Ti0.8Cr0.2)N | 1 | (Ti0.2Cr0.2Al0.55Si0.05)N | 5 | 10 | 2 | 5.0 | 2.3 | 0.56 |
| 23 | Ti(C0.5N0.5) | 1 | (Ti0.2Cr0.2Al0.55Si0.05)N | 5 | 10 | 2 | 5.0 | 2.4 | 0.48 |

TABLE 2

| | Layer-A | | Layer-B | | | Number of lamination | Thickness ratio of layer-B to layer-A (Thickness of layer-B/ Thickness of layer-A) | Wear resistance | Film removability (Film removal time taken for sample of interest/ Film removal time taken for control reference sample) |
|---|---|---|---|---|---|---|---|---|---|
| No. | Component composition | Thickness (μm) | Component composition | Thickness (μm) | Total thickness (μm) | units in laminated structure | | Depth of wear (μm) | |
| 24 | (Ti0.9Si0.1)N | 1 | (Ti0.2Cr0.2Al0.55Si0.05)N | 5 | 10 | 2 | 5.0 | 2.5 | 0.58 |
| 25 | (Ti0.95B0.05)N | 1 | (Ti0.2Cr0.2Al0.55Si0.05)N | 5 | 10 | 2 | 5.0 | 2.4 | 0.53 |
| 26 | (Ti0.8W0.2)N | 1 | (Ti0.2Cr0.2Al0.55Si0.05)N | 5 | 10 | 2 | 5.0 | 2.5 | 0.45 |
| 27 | (Ti0.8V0.2)N | 1 | (Ti0.2Cr0.2Al0.55Si0.05)N | 5 | 10 | 2 | 5.0 | 2.3 | 0.48 |
| 28 | TiN | 0.5 | (Ti0.2Cr0.2Al0.5Si0.1)N | 5 | 10 | 2 | 10.0 | 3 | 0.35 |
| 29 | TiN | 0.5 | (Ti0.2Cr0.2Al0.45Si0.15)N | 5 | 10 | 2 | 10.0 | 3.2 | 0.30 |
| 30 | TiN | 0.5 | (Ti0.1Cr0.2Al0.7)N | 5 | 10 | 2 | 10.0 | 3.2 | 0.58 |
| 31 | TiN | 0.5 | (Ti0.2Cr0.2Al0.5B0.1)N | 5 | 10 | 2 | 10.0 | 3.4 | 0.60 |
| 32 | TiN | 0.4 | (Ti0.2Cr0.2Al0.52Si0.03B0.05)N | 5 | 10 | 2 | 12.5 | 2.4 | 0.33 |
| 33 | TiN | 0.4 | (Ti0.2Cr0.2Al0.55B0.05)N | 5 | 10 | 2 | 12.5 | 2.8 | 0.44 |
| 34 | TiN | 0.5 | (Nb0.2Cr0.2Al0.6)N | 5 | 10 | 2 | 10.0 | 2.1 | 0.45 |
| 35 | TiN | 0.5 | (Nb0.2Cr0.2Al0.55Si0.05)N | 5 | 10 | 2 | 10.0 | 3 | 0.38 |
| 36 | TiN | 0.5 | (Nb0.2Cr0.2Al0.55Si0.05)N | 5 | 10 | 2 | 10.0 | 2.9 | 0.61 |
| 37 | TiN | 0.5 | (Nb0.2Cr0.2Al0.55Si0.03B0.02)N | 5 | 10 | 2 | 10.0 | 3.2 | 0.38 |
| 38 | TiN | 0.5 | (Ti0.5Cr0.5)N | 5 | 10 | 2 | 10.0 | 4.7 | 0.40 |
| 39 | TiN | 0.5 | (Ti0.5Cr0.3Al0.2)N | 5 | 10 | 2 | 10.0 | 4.3 | 0.35 |
| 40 | TiN | 0.5 | (Ti0.55Cr0.15Si0.3)N | 5 | 10 | 2 | 10.0 | 3.4 | 0.30 |
| 41 | TiN | 0.5 | (Nb0.5Cr0.5)N | 5 | 10 | 2 | 10.0 | 4.5 | 0.40 |
| 42 | TiN | 0.5 | CrN | 5 | 10 | 2 | 10.0 | 4.7 | 0.35 |
| 43 | TiN | 0.5 | (Al0.6Cr0.4)N | 5 | 10 | 2 | 10.0 | 4.2 | 0.40 |
| 44 | TiN | 0.5 | (Ti0.5Al0.5)N | 5 | 10 | 2 | 10.0 | 5.8 | 0.80 |
| 45 | TiN | 0.5 | (Ti0.45Cr0.05Al0.5)N | 5 | 10 | 2 | 10.0 | 4.3 | 0.60 |
| 46 | TiN | 0.5 | (Ti0.4Cr0.1Al0.5)N | 5 | 10 | 2 | 10.0 | 3.4 | 0.40 |
| 47 | TiN | 0.5 | (Ti0.7Al0.3)N | 5 | 10 | 2 | 10.0 | 6.5 | 0.80 |
| 48 | TiN | 0.5 | (Ti0.65Cr0.1Al0.25)N | 5 | 10 | 2 | 10.0 | 5.7 | 0.80 |

As shown in TABLES 1 and 2, samples No. 2 to 4, 9 to 15, 17 to 19, 22 to 43, 45, and 46 each having a coating film (layer-A and layer-B) formed in a component composition satisfying the ranges specified in the present invention were preferable in terms of wear resistance and enhancement effect on film removability.

According to the results of examinations of samples No. 2 to 4, it was found that the thickness of the layer-A should preferably be within the range of 0.5 to 2 μm from the viewpoint of enhancement effect on film removability. Further, according to the results of examinations of samples No. 11 to 15, it was found that the thickness of the layer-B should preferably not exceed 5 μm, more preferably not exceed 3 μm. Still further, according to the results of examinations of samples No. 28 to 37, the degree of enhancement effect on film removability was found to be remarkable in cases where Si was contained in the layer-B.

In each of samples No. 38 to 43, 45, and 46 satisfying the ranges specified in the present invention, the component composition of the layer-B did not satisfy the preferable range thereof. On this account, these samples were somewhat inferior in wear resistance to the samples having a component composition of the layer-B satisfying the preferable range thereof.

In each of samples No. 1, 5 to 8, 16, 20, 21, 44, 47, and 48 not satisfying the ranges specified in the present invention, the wear resistance and enhancement effect on film removability were unacceptable.

Sample No. 1 was inferior in enhancement effect on film removability since the thickness of the layer-A was less than the specified lower limit. Sample No. 5 was inferior in wear resistance and enhancement effect on film removability since the thickness of the layer-A exceeded the specified upper limit and also the thickness ratio of the layer-B to the layer-A was less than the specified lower limit. Sample No. 6 was inferior in wear resistance since the thickness of the layer-B was less than the specified lower limit and also the thickness ratio of the layer-B to the layer-A was less than the specified lower limit.

Sample No. 7 was inferior in wear resistance since the total thickness of the layers-B was less than the specified lower limit. Further, in this sample No. 7, no significant enhancement effect on film removability was brought about since the thickness of each layer-B was rather small. Sample No. 8 was inferior in wear resistance since the total thickness of the layers-B was less than the specified lower limit. Sample No. 16 was inferior in enhancement effect on film removability since the thickness of the layer-B exceeded the specified upper limit. Samples No. 20 and 21 were inferior in enhancement effect on film removability since the content of Ti in the layer-A was less than the specified lower limit. Sample No. 44 was inferior in wear resistance since no Cr was contained in the layer-B. In this sample No. 44, little enhancement effect on film removability was brought about since the corresponding original film removability was rather high. Samples No. 47 and 48 were inferior in wear resistance since the content of Ti in the layer-B exceeded the specified upper limit. In these samples No. 47 and 48, little enhancement effect on film removability was brought about since the corresponding original rate of film removal was rather high.

Example 2

The degree of effect of provision of the protective film was examined in Example 2.

In the same manner as in Example 1, a coating film was formed on each substrate. A mirror-finished JIS-SKD11 substrate (indicated as SKD11 in TABLE 2) or a cemented carbide substrate (indicated as CEMENTED CARBIDE in TABLE 2) was used in Example 2. Except some samples, a protective film (CrN film) having a predetermined thickness was formed between the substrate and the coating film. For forming the protective film, a Cr target was employed, and in an atmosphere of $N_2$ gas, arc ion plating was carried out.

After completion of the film formation mentioned above, the metallic component compositions of the coating film and protective film were examined, and also the degree of substrate protection was evaluated.

<Component Composition of Coating Film>

The composition of metallic component elements in each of the layer-A and layer-B was measured by using an EPMA (Electron Probe Micro Analyzer).

<Degree of Protection>

Before and after film removal, the surface roughness of each sample substrate was measured by using a surface roughness tester. The measurement conditions were as follows:

Scanning length: 1 mm
Scanning time: 15 seconds
Roughness value: Average roughness (Ra)

In evaluation of the degree of protection, a variation of ±0.02 μm in average roughness (Ra) between the states before and after film removal was judged to be acceptable.

TABLE 3 shows the results of the evaluations.

TABLE 3

| | | Protective film | | Layer-A | | Layer-B | | | Number of lamination units in laminated structure | Degree of protection Surface roughness (Ra) | |
|---|---|---|---|---|---|---|---|---|---|---|---|
| No. | Substrate Kind | Component composition | Thickness (μm) | Component composition | Thickness (μm) | Component composition | Thickness (μm) | Total thickness (μm) | | Before film removal (μm) | After film removal (μm) |
| 49 | SKD11 | None | None | TiN | 0.5 | (Ti0.2Cr0.2Al0.55Si0.05)N | 5 | 10 | 2 | 0.02 | 0.10 |
| 50 | SKD11 | CrN | 0.2 | TiN | 0.5 | (Ti0.2Cr0.2Al0.55Si0.05)N | 5 | 10 | 2 | 0.02 | 0.08 |
| 51 | SKD11 | CrN | 0.5 | TiN | 0.5 | (Ti0.2Cr0.2Al0.55Si0.05)N | 5 | 10 | 2 | 0.02 | 0.02 |
| 52 | SKD11 | CrN | 1 | TiN | 0.5 | (Ti0.2Cr0.2Al0.55Si0.05)N | 5 | 10 | 2 | 0.02 | 0.02 |
| 53 | SKD11 | CrN | 5 | TiN | 0.5 | (Ti0.2Cr0.2Al0.55Si0.05)N | 5 | 10 | 2 | 0.02 | 0.02 |
| 54 | Cemented Carbide | None | None | TiN | 0.5 | (Ti0.2Cr0.2Al0.55Si0.05)N | 5 | 10 | 2 | 0.01 | 0.07 |
| 55 | Cemented Carbide | CrN | 0.2 | TiN | 0.5 | (Ti0.2Cr0.2Al0.55Si0.05)N | 5 | 10 | 2 | 0.01 | 0.07 |

TABLE 3-continued

| No. | Substrate Kind | Protective film Component composition | Thickness (μm) | Layer-A Component composition | Thickness (μm) | Layer-B Component composition | Thickness (μm) | Total thickness (μm) | Number of lamination units in laminated structure | Degree of protection Surface roughness (Ra) Before film removal (μm) | After film removal (μm) |
|---|---|---|---|---|---|---|---|---|---|---|---|
| 56 | Cemented Carbide | CrN | 0.5 | TiN | 0.5 | (Ti0.2Cr0.2Al0.55Si0.05)N | 5 | 10 | 2 | 0.01 | 0.02 |
| 57 | Cemented Carbide | CrN | 1 | TiN | 0.5 | (Ti0.2Cr0.2Al0.55Si0.05)N | 5 | 10 | 2 | 0.01 | 0.01 |
| 58 | Cemented Carbide | CrN | 5 | TiN | 0.5 | (Ti0.2Cr0.2Al0.55Si0.05)N | 5 | 10 | 2 | 0.01 | 0.01 |
| 59 | Cemented Carbide | None | None | TiN | 0.5 | (Nb0.2Cr0.2Al0.6)N | 5 | 10 | 2 | 0.04 | 0.10 |
| 60 | Cemented Carbide | CrN | 0.2 | TiN | 0.5 | (Nb0.2Cr0.2Al0.6)N | 5 | 10 | 2 | 0.04 | 0.08 |
| 61 | Cemented Carbide | CrN | 0.5 | TiN | 0.5 | (Nb0.2Cr0.2Al0.6)N | 5 | 10 | 2 | 0.04 | 0.05 |
| 62 | Cemented Carbide | CrN | 1 | TiN | 0.5 | (Nb0.2Cr0.2Al0.6)N | 5 | 10 | 2 | 0.04 | 0.04 |
| 63 | Cemented Carbide | CrN | 5 | TiN | 0.5 | (Nb0.2Cr0.2Al0.6)N | 5 | 10 | 2 | 0.04 | 0.04 |

As shown in TABLE 3, samples No. 51 to 53, 56 to 58, and to 63 each having a protective film formed in a thickness of at least 0.5 μm were superior in the degree of substrate protection. In each of samples No. 50, 55, and 60, since the thickness of the protective film was less than 0.5 μm, the degree of substrate protection was inferior to those of the samples having a protective film formed in a thickness of 0.5 μm or more. In each of samples No. 49, 54, and 59, since no protective film was formed, the degree of substrate protection was inferior to those of the samples having a protective film formed in a thickness of 0.5 μm or more.

What is claimed is:
1. A hard-coated material, comprising:
a substrate; and
a hard-coating film on the substrate;
wherein the hard-coating film, comprises:
at least two lamination units in laminated structure formation,
wherein a lamination unit comprises, laminated alternately in succession:
a lower layer-A; and
an upper layer-B;
wherein
a first lower layer A is on the substrate, and
each layer-A has a component composition of formula:

$Ti_vM_{1-v}(C_xN_yO_z)$, wherein
M is at least one specie selected from the group consisting of Group-4 elements, Group-5 elements, Group-6 elements, Si, Al, B, and Y, excluding Ti;
$0.6 \leq v \leq 1$
$0 \leq z \leq 0.1$
$x+y+z=1$;

each layer-B has a component composition of formula:

$Ti_vCr_wM_{1-v-w}(C_xN_yO_z)$, wherein M is at least one specie selected from the group consisting of Group-4 elements, Group-5 elements, Group-6 elements, Si, Al, B, and Y, excluding Ti and Cr;
$0 \leq v \leq 0.6$
$0.05 < w$
$v+w \leq 1$
$0 \leq x \leq 0.5$
$0 \leq z \leq 0.1$
$x+y+z=1$;
wherein a thickness ratio of a layer-B to a layer-A is at least 2; and
a thickness of a layer-A is within the range of 0.1 to 3 μm both inclusive,
a thickness of layer-B is within the range of 1 to 10 μm both inclusive, and
a total thickness of a plurality of layers-B is at least 5 μm.

2. The hard-coated material according to claim 1, wherein each layer-A has a component composition of formula: TiN; and
each layer-B has a component composition of formula:

$(Ti_aCr_bAl_cSi_dB_e)(C_xN_y)$, wherein
$0.05 \leq a \leq 0.3$
$0.1 \leq b \leq 0.4$
$0.4 \leq c \leq 0.75$
$0 \leq d \leq 0.15$
$0 \leq e \leq 0.1$
$a+b+c+d+e=1$
$0.5 \leq y \leq 1$
$x+y=1$.

3. The hard-coated material according to claim 1, wherein each layer-A has a component composition of formula: TiN; and
each layer-B has a component composition of formula:

$$(Nb_fCr_gAl_hSi_iB_j)(C_xN_y)$$

wherein
$0.05 \leqq f \leqq 0.3$
$0.1 \leqq g \leqq 0.4$
$0.4 \leqq h \leqq 0.7$
$0 \leqq i \leqq 0.15$
$0 \leqq j \leqq 0.1$
$f+g+h+i+j=1$
$0.5 \leqq y \leqq 1$
$x+y=1$.

4. The hard-coated material to claim 1, further comprising:
a protective CrN film having a thickness of at least 0.5μm between the substrate and the hard-coating film.

5. The hard-coated material to claim 2, further comprising:
a protective CrN film having a thickness of at least 0.5μm between the substrate and the hard-coating film.

6. The hard-coated material to claim 3, further comprising;
a protective CrN film having a thickness of at least 0.5μm between the substrate and the hard-coating film.

* * * * *